(12) United States Patent
Ozmat

(10) Patent No.: US 6,196,307 B1
(45) Date of Patent: Mar. 6, 2001

(54) HIGH PERFORMANCE HEAT EXCHANGER AND METHOD

(75) Inventor: Burhan Ozmat, Voorheesville, NY (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/098,517

(22) Filed: Jun. 17, 1998

(51) Int. Cl.[7] .................................................. F28F 7/00
(52) U.S. Cl. .................... 165/185; 165/DIG. 907; 165/80.3
(58) Field of Search .................... 165/80.1–80.5, 165/133, 907, 185

(56) References Cited

U.S. PATENT DOCUMENTS

| | | | |
|---|---|---|---|
| 3,049,795 | * | 8/1962 | Valyi ..................................... 165/907 |
| 4,064,914 | * | 12/1977 | Grant ..................................... 165/133 |
| 4,719,968 | * | 1/1988 | Speros ..................................... 165/907 |
| 4,753,849 | * | 6/1988 | Zohler ..................................... 165/907 |
| 4,873,835 | * | 10/1989 | Rojey et al. ............................ 165/907 |
| 4,898,234 | * | 2/1990 | McGovern et al. ................... 165/907 |
| 5,145,001 | * | 9/1992 | Valenzuela ............................ 165/80.3 |
| 5,150,274 | * | 9/1992 | Okada et al. ......................... 165/80.4 |
| 5,205,353 | * | 4/1993 | Willemsen et al. ................... 165/185 |

* cited by examiner

*Primary Examiner*—Ira S. Lazarus
*Assistant Examiner*—Terrell McKinnon
(74) *Attorney, Agent, or Firm*—Carter, Ledyard & Milburn

(57) ABSTRACT

A heat exchanger and method for cooling power electronics modules. The power electronics module transferring heat generated during operation to the heat exchanger through a thermal base of the power module. The heat exchanger being directly bonded to the thermal base and comprising a metal foam. The metal foam having a network of metal ligaments forming numerous open cells to provide porosity. The metal ligaments are aligned to provide a higher metal density in cross-sectional planes of the foam perpendicular to the intended direction of heat flow.

32 Claims, 4 Drawing Sheets

10 ppi foam laterally compressed in the plane of the page to 15% density.

10 ppi foam laterally compressed in the plane perpendicular to the plane of the paper.

10 ppi foam laterally compressed in a direction perpendicular to the plane of the paper to 40% density.

10 ppi foam laterally compressed in the plane of the paper to 40% density.

(10 ppi, 8% density foam-equaixed cells)

HIGH PERFORMANCE HEAT EXCHANGER AND METHOD

BACKGROUND OF THE INVENTION

The present invention relates to heat exchangers and, more specifically, relates to a metal foam heat exchanger having a surface for direct bonding to an electronic module.

Performance, reliability and packaging efficiency of advanced power electronics modules strongly depend on their ability to effectively remove dissipated energy. The effectiveness of the heat removal directly translates to lowering the junction temperatures of power semiconductor devices. Lower junction temperatures result in lower reverse saturation current of p-n junctions, higher switching speeds in MOSFET structures, increased reliability of metalized and bonded interfaces and a reduction in operating temperature.

Heat exchangers or heat sinks are metal heat radiators designed to remove heat from electronic components, particularly power transistor modules, by thermal conduction, convection, or radiation. Heat exchangers dissipate heat at a surface of an electronic module which may be generated by an internal junction of a semiconductor device within the module. Heat exchangers may also transfer heat from the location of device being cooled to another location by providing passages for a fluid coolant to flow through the heat exchanger.

In one known technique for cooling electronic modules, an oversized cold plate is attached to the module. The oversized cold plate reduces module temperatures by heat spreading and increasing the surface area for heat dissipation. However, the cold plate adversely increases the weight, volume, and cost of modules. Additionally, bonding the cold plate to the module requires the use of soft polymeric compounds which have high thermal resistance.

Accordingly, it is an object of the present. invention to provide a novel heat exchanger and method.

It is another object of the present invention to provide a novel integrated heat exchanger and thermal base plate assembly.

It is yet another object of the present invention to provide a novel metal foam for transferring heat from an electronic module.

It is still another object of the present invention to provide a novel metal foam having a surface for bonding directly to an electronic module where the metal foam provides a heat transfer path for the electronic module.

It is a further object of the present invention to provide a novel heat exchanging foam having a network of metal ligaments for cooling an electronic module by pulling heat away from the module through the metal ligaments and transferring heat in the metal ligaments to another location by directing a fluid coolant through interconnected voids which are formed by ligament surfaces.

It is yet a further object of the present invention to provide a novel heat exchanging metal foam having a network of metal ligaments forming elongated substantially ellipsoidal shaped voids oriented in one direction for directing a fluid coolant through the foam.

It is still a further object of the present invention to provide a novel heat exchanger having plural blocks of metal foam positioned in series on a surface of an electronic module where the blocks have variable thermal performance.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
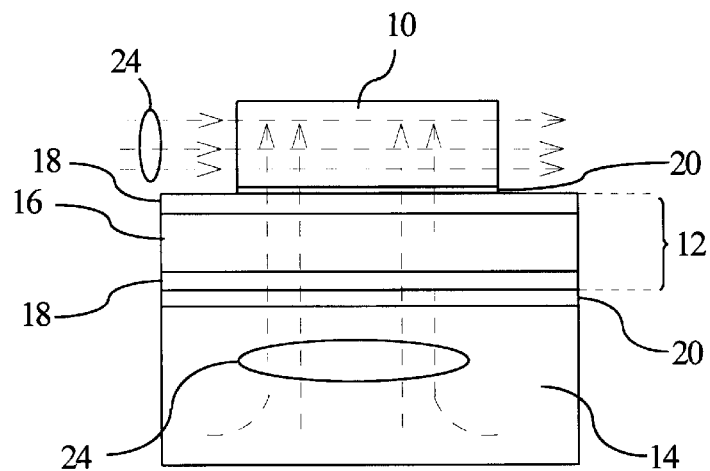
FIG. 1 is a pictorial of one embodiment of a heat exchanger of the present invention.

With reference to FIG. 1, a heat exchanger may include a block of porous metal foam 10. An electronic module to be cooled by the heat exchanger may include thermal base plate 12 and a semiconductor device 14. The thermal base plate 12 may have metalized surfaces 18 for direct bonding with the block 10 and the semiconductor device 14. Direct bonding may be achieved through soldering, active brazing, or simply brazing.

The thermal base plate 12 may be made of any thermally conducting and electrically insulating substrate having a metalizable surfaces and having a coefficient of thermal expansion (CTE) that is substantially matching with the CTE of the silicon power semiconductor device 14 such as AlN, BeO, Metal Matrix Composites, layered or infiltrated all metal composites (e.g., CuMo).

The metal foam 10 may be made of aluminum, copper, or silver. The metal foam heat exchanger 10 may be directly bonded to a low expansion, thermal base plate 12. The CTE of the base plate and metal foam may be substantially different, any physical stresses due to mismatching levels of thermal expansion is minimized by the structural compliance of the foam. Physical stresses due to mismatching level of thermal expansion may be induced by the heat flux generated during the operation of the module or due to the temperature variations in the intended work environment of the module. The effective modulus of the metal foam structures, which scales the thermal mismatch stresses, is known to be proportional to the square of the foam relative density. To provide solderable metalization, a block of aluminum foam may be electroplated with copper and soldered to the thermal base 12 with paste 20.

The $R_{jb}$, junction-to-base thermal resistance of a power module with directly bonded foam based heat exchanger, may be as low as 0.07° OC./(Watt*in$^2$). The foam may provide an $R_{ba}$, base-to-ambient thermal resistance, of up to about 0.01° C./Watt for a 1 inch surface contact.

The electronic module to be cooled may be any form of generic high density intelligent and dumb power module which may house a multiplicity of power semiconductor dies (MCT, MOSFET, IGBT, or alike) and diodes as the basic elements of single or multiple switches. The thermal base 12 and the semiconductor device 14 may be considered as being an electronic module or portions of an electronic module which is to be cooled.

In operation, heat 24 generated by the semiconductor device 14 radiates through the thermal base plate 12 into block 10. Heat in block 10 is dissipated through convection by directing a fluid coolant 25 through the block 10 in a direction perpendicular to heat flow 24.

FIGS. 2a–2d are magnified photographs of the metal foam which illustrate the internal structure of the metal foam. As illustrated the metal foam may include a network of ligaments or wires which form numerous open cells. The ligaments are aligned to be in a direction which is substantially parallel to the direction of heat flowing from an electronic module. The aligned metal ligaments provide a higher metal density in cross-sectional planes of the foam perpendicular to the intended direction of heat flow. Due to the higher ligament density, the foam has a lower thermal resistance in the direction in which the ligaments are aligned than in any other direction.

The alignment of the ligaments forces the cells to be aligned in the same direction as the ligaments. The open cells may also be considered pores or voids. The shape of the cells may be substantially ellipsoidal or be considered to be of an equiaxed shape which has been collapsed uniaxially or biaxially. The cells may have opening to permit fluid coolants to pass from cell to cell. The cells are randomly distributed throughout the foam. The cell density of the foam in terms of average number of cells or pores per inch and volumetric density of the foam defines the surface area per unit volume of the metal foam. The porosity of the metal foam is due to gaps in the ligaments which allows a fluid coolant to be passed through the foam in any direction.

The metal foam is fabricated by expanding and solidifying a pool of liquid metal saturated with an inert gas under pressure. The solidification takes place as the saturated gas expands to atmospheric pressure. Density of the porous metal is varied by applying different levels of pressure. The porosity of the foam after solidification may be in the range of 85% to 95% with the open cells generally being equiaxed voids that are randomly distributed throughout the foam.

Figure 3:
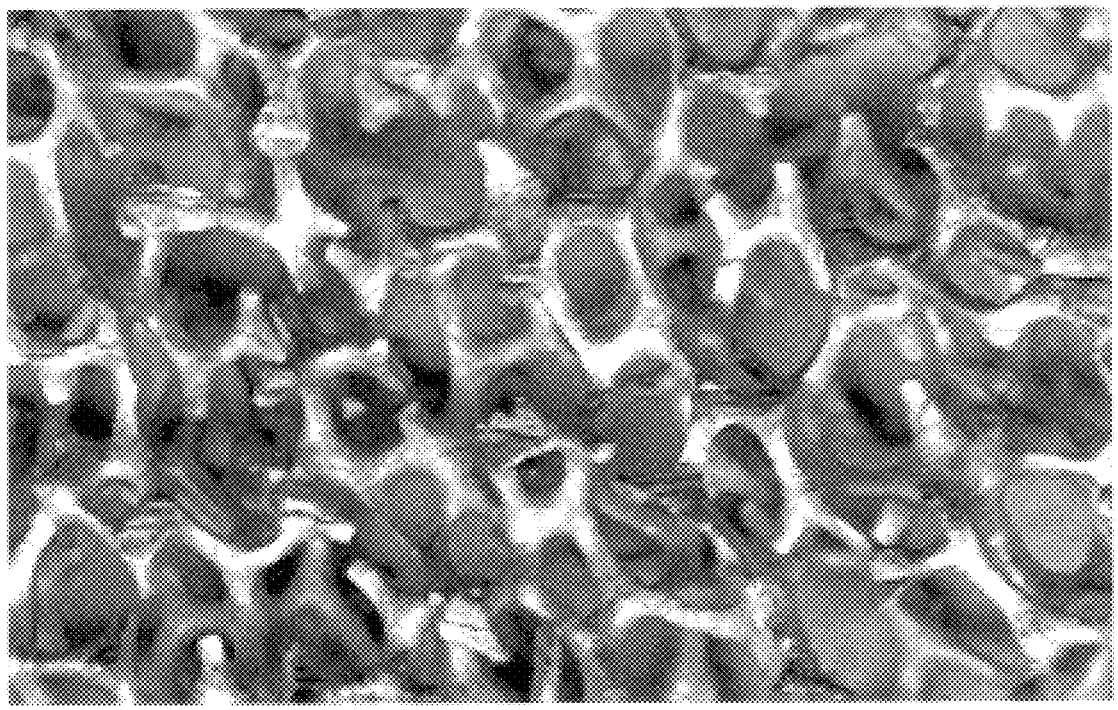
FIG. 3 is a magnified photographic view of a representative cross-section of a block of metal foam having randomly distributed equiaxed cells.

Metal foam having randomly distributed equiaxed pores is commercially available (illustrated in FIG. 3). The commercially available porous aluminum foam provides a pore density of up to 40 pores per inch, a surface area of approximately 10 to 50 $in^2/in^3$ (ligament surface area/metal foam volume) and theoretical mass density of 10% to 20%.

Since the heat flux of the module is one dimensional, the commercially available foam having randomly distributed equiaxed cells is not suitable for electronic module heat transfer applications. To significantly improve the thermal capability of the foam, the randomly distributed ligaments and cells are aligned in the direction parallel to the direction of heat flux to be removed. The alignment is accomplished by compressing and annealing the metallic foam in multiple steps until a desired volumetric density and level of alignment is obtained. The alignment process requires inelastic deformation of the foam through lateral compression. The deformation may be uniaxial or biaxial. After the alignment process, the randomness of the cells (i.e., in size, direction and radius) tends to disappear and the cells have a preferred orientation in a direction perpendicular to the surface of the module. The compression also increases the surface area of ligaments. The volumetric density of the foam may be varied from a before alignment density of 5% to 15% up to theoretically 100% (the pore volume density goes to zero as solid density goes to 100%. The deformation of the foam allows the tailoring of the flow resistance. (pressure drop), thermal performance, and structural compliance of the foam.

The aligned foam may provide 150 $in^2$ heat transfer area in a 2 by 1.5 by 0.25 inch sized cavity with a flow resistance of less than 10 psi for up to 2 gpm flow rate for a typical liquid coolants such as water and FC-40. To achieve the same surface area in the same volume with an extruded aluminum based heat exchanger 0.005 inch wide fins with 0.005 inch spacing is required.

In application, the foam may be about 0.05 to 1.00 inches thick. Preferably, the thickness of the block of metal foam is at least about 0.100 inches which may provide a junction to ambient thermal resistance of 0.07 C/Watt for a 1 inch base/foam contact. The foam primarily enhances the surface area and the forced convection coefficients. Further, the three dimensional pseudo-random structure of the foam eliminates macroscopic scale film boiling and provides a high rate of heat transfer through increased number of nucleation sites over the extended surface.

The porosity of the foam must be sufficient to permit continuous flow of fluid coolant. The foam may have a porosity of between about 5 and about 50 pores per inch. The foam may have a volumetric density of between about 2% and 50%. The foam may have a total surface area of between about 2 and about 300 inches squared per cubic inch of foam ($in^2/in^3$).

In packaging, the metallic foam may be a current carrying electrode as well as a heat exchanger. Further, because of the adjustable level of porosity, copper or silver foams can be deposited with CVD diamond to maximize conductivity and cooling capability.

Figure 4:
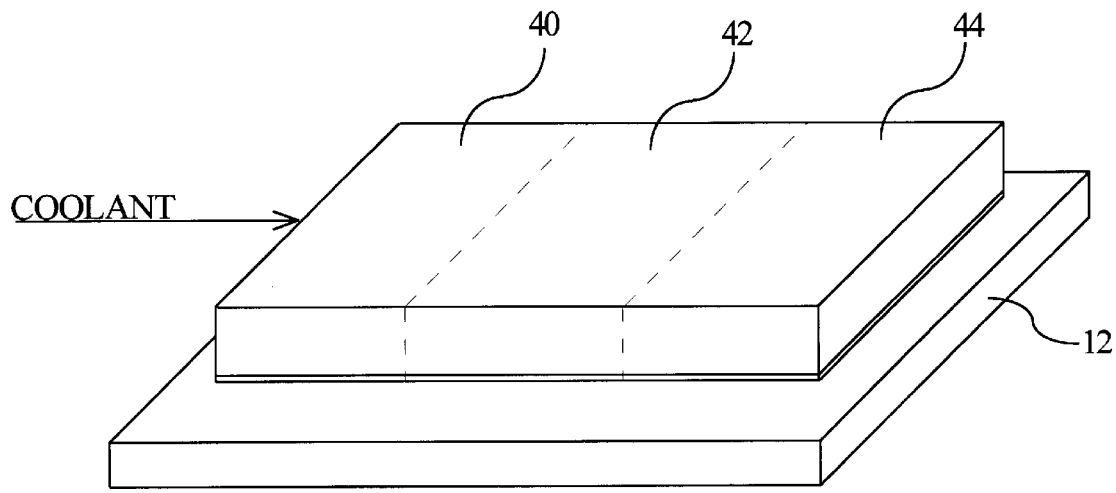
FIG. 4 is a pictorial of a second embodiment of a heat exchanger of the present invention.

With reference to FIG. 4, a heat exchanger may include several blocks of metal foam 40, 42, and 44 positioned in series. The blocks 40, 42, and 44 may be directly bonded to a thermal base 12. The blocks 40, 42, and 44 may have varying densities in order to match varying heat dissipation requirements on the surface of the module. Additionally, smaller blocks may have better structural compliance and are easier to bond.

Figure 5:
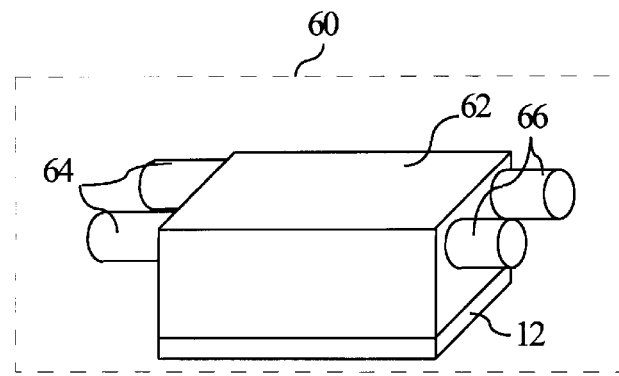
FIG. 5 is a pictorial of one embodiment of an integrated heat exchanger/thermal base plate assembly of the present invention.
Figure 2A:
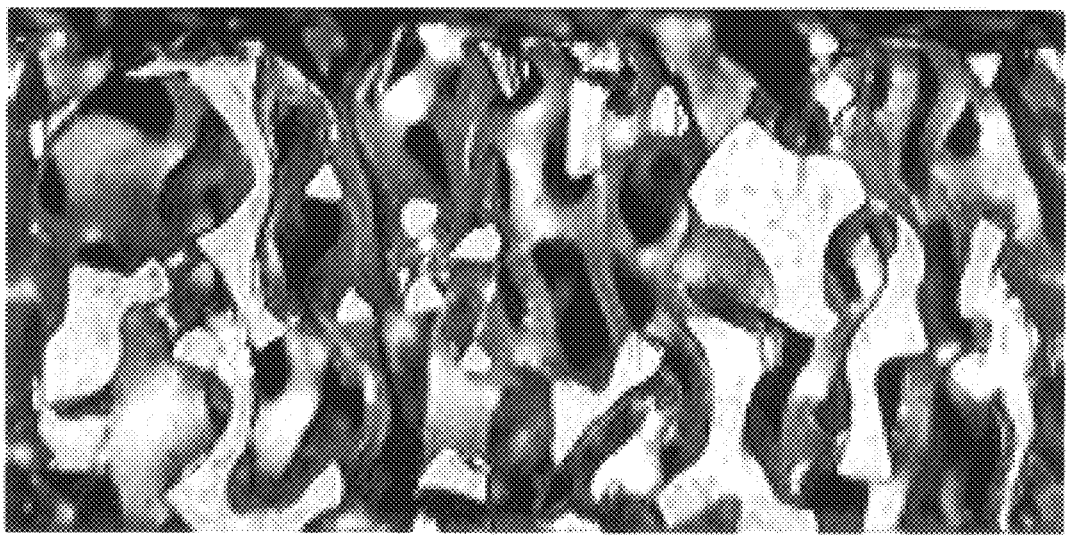
FIGS. 2a–2d are magnified photographic views of a representative cross-section of a block of metal foam.
Figure 2B:
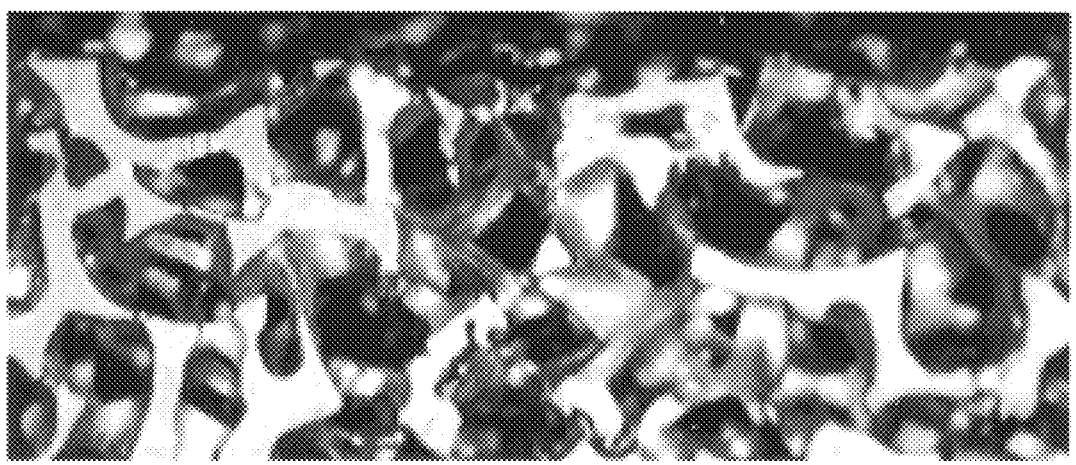
Figure 2C:
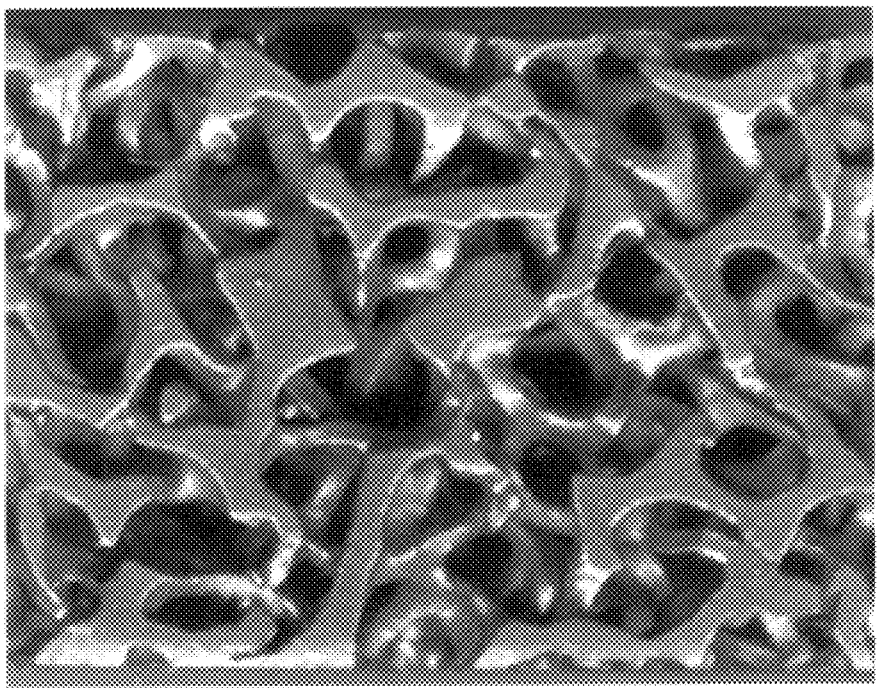
Figure 2D:
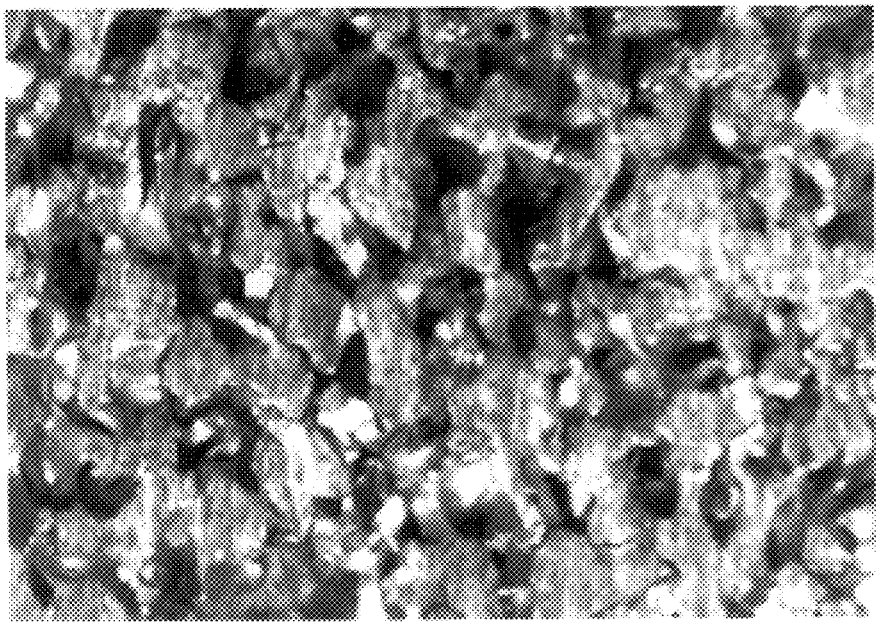

With reference to FIG. 5, an integrated heat sink/thermal base assembly 60 may include a thermal base plate 12, and a casing 62, enclosing a block of metal foam (shown in FIGS. 1–3). The casing may include manifolds 64 and 66.

In operation, convective cooling is accomplished by directing a fluid coolant through the block. The coolant may be directed into the assembly through inlet manifolds 64 and directed out of the assembly through outlet manifolds 66.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A block of metal foam adapted to be positioned in a heat conducting relationship with an electronic module to be cooled comprising:

a flat surface adapted to bond to a flat surface of an electronic module for transferring heat from the module to said block in a first direction perpendicular to the flat surface of block; and numerous void cells randomly distributed in the foam for passing a fluid coolant through said block in a second direction generally parallel to the flat surface of said block, said cells having an orientation parallel to the first direction and orthogonal to the flat surface of said block and having openings for passing a fluid coolant from cell to cell in the second direction parallel to the flat surface.

2. The block of claim 1 wherein:
- the flat surface of said block is adapted to be bonded directly to a flat surface of the electronic module with a thermally conducting bonding material;
- the metal of said block and the material of the electronic module have substantially different coefficients of thermal expansion; and
- the structural compliance of said block is such that the physical integrity of said block, said module, and the bonding material is maintained during module operation.

3. The block of claim 1 wherein the metal is one of the group consisting of aluminum, copper, and silver.

4. The block of claim 1 wherein said block is between about 0.050 inches and about 1.000 inch in thickness.

5. The block of claim 1 wherein the foam has a porosity between about 5 and about 100 pores per inch.

6. The block of claim 1 the flat surface of said block is adapted to bond directly to the surface of the electronic module by a thermally conducting bonding material.

7. The block of claim 6 wherein said bond is by brazing.

8. The block of claim 6 wherein said bond is by soldering.

9. The block of claim 1 wherein the flat surface of said block is adapted to bond directly to a metalized ceramic surface of the electronic module.

10. The block of claim 1 wherein the flat surface of said block is adapted to bond directly to a metal surface of the electronic module.

11. The block of claim 1 wherein said block comprises:
- plural blocks of metal foam positioned contiguously in series, the physical characteristics of each of said plural blocks being selected as a function of the position of each of said plural blocks on the surface of said electronic module.

12. An integrated heat exchanger/thermal base plate assembly comprising:
- a block of metallic foam having a bonding surface;
- a thermal base plate of an electronic module made of a material from the group of a metal, metal matrix composite, and a ceramic, said base plate being coated with metallization for direct bonding with the bonding surface of said block; and
- a casing sealed to said base plate for providing a housing for said block having paths for directing a coolant through said casing parallel to said base plate.

13. The assembly of claim 12 wherein said block comprises:
- plural blocks of metallic foam positioned in series and directly bonded to said thermal base for providing variable heat sink performance as a function of the location of said plural blocks on said thermal base plate.

14. The assembly of claim 12 wherein said casing is primarily formed from a metal.

15. The assembly of claim 12 wherein said casing is primarily formed from a material which is one of a group consisting of a polymer, a metal, a composite polymer, and a composite metal.

16. The assembly of claim 12 wherein said casing comprises plural manifolds as paths for directing a coolant through said casing.

17. The assembly of claim 12 wherein said block and said thermal base plate are directly bonded by brazing.

18. The assembly of claim 12 wherein said block and said thermal base plate are directly bonded by soldering.

19. The assembly of claim 12 wherein said block and said thermal base plate are directly bonded through a thermally conducting bonding material.

20. The assembly of claim 12, wherein the block of metallic foam comprises:
- a flat surface adapted to bond to a flat surface of an electronic module for transferring heat from the module to said block in a first direction perpendicular to the flat surface of block; and
- numerous void cells randomly distributed in the foam for passing a fluid coolant through said block in a second direction generally parallel to the flat surface of said block,
- said cells having an orientation orthogonal to the flat surface of said block and having openings for passing a fluid coolant from cell to cell.

21. The assembly of claim 20, wherein the block of metal foam is between about 0.050 inches and about 1.0 inches thick.

22. The assembly of claim 20, wherein the block of metal foam has a porosity between about 5 and about 100 pores per inch.

23. The assembly of claim 12, wherein the block of metallic foam comprises:
- a network of metal ligaments forming numerous randomly distributed elongated substantially ellipsoidal shaped voids of approximately the same size oriented in a first direction, said ligaments having gaps for passing a fluid coolant through adjacent of said voids, and a higher ligament density in a direction generally perpendicular to the first direction than in a direction generally parallel to the first direction.

24. The assembly of claim 23, wherein the block of metal foam between about 5 and about 100 voids per inch.

25. The assembly of claim 23, wherein the block of metal foam has a volumetric density of between about 2% and about 50%.

26. The assembly of claim 23, wherein the block of metal foam has provides a junction to ambient thermal resistance of up to about 0.12 C/Watt for a 1 inch surface contact.

27. A heat exchanging foam comprising a network of metal ligaments forming numerous randomly distributed elongated substantially ellipsoidal shaped voids of approximately the same size oriented in a first direction,
- said ligaments having gaps for passing a fluid coolant through adjacent of said voids, and a higher ligament density in a direction generally perpendicular to the first direction than in a direction generally parallel to the first direction.

28. The heat exchanging foam of claim 27 wherein the metal ligaments are formed from a metal from a group consisting of aluminum, copper, and silver.

29. The heat exchanging foam of claim 27 wherein the foam has between about 5 and about 100 voids per inch.

30. The heat exchanging foam of claim 27 wherein the foam has a volumetric density of between about 2% and 50%.

31. The heat exchanging foam of claim 27 wherein the foam has a surface area of between about 2 and about 300 inches squared per cubic inch of foam.

32. The heat exchanging foam of claim 27 wherein the foam is for providing a junction to ambient thermal resistance of up to about 0.12° C./watt for a 1 inch surface contact.

* * * * *